(12) United States Patent
Sekiya

(10) Patent No.: US 8,574,930 B2
(45) Date of Patent: Nov. 5, 2013

(54) TOOL CUTTING METHOD FOR WORKPIECE HAVING A PLURALITY OF LED CHIPS SEALED BY SEALING MEMBER

(71) Applicant: Disco Corporation, Tokyo (JP)

(72) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 13/706,616

(22) Filed: Dec. 6, 2012

(65) Prior Publication Data

US 2013/0164864 A1 Jun. 27, 2013

(30) Foreign Application Priority Data

Dec. 27, 2011 (JP) .................................. 2011-285576

(51) Int. Cl.
*H01L 21/66* (2006.01)
(52) U.S. Cl.
USPC ............................................................. 438/14
(58) Field of Classification Search
None
See application file for complete search history.

(56) References Cited

U.S. PATENT DOCUMENTS

| | | | | |
|---|---|---|---|---|
| 5,962,971 A | * | 10/1999 | Chen | 313/512 |
| 6,441,548 B1 | * | 8/2002 | Arimoto | 313/491 |
| 7,157,839 B2 | * | 1/2007 | Ouderkirk et al. | 313/111 |
| 7,221,003 B2 | * | 5/2007 | Ueno et al. | 257/98 |
| 7,700,002 B2 | * | 4/2010 | Schmidt et al. | 252/301.4 F |
| 8,096,677 B2 | * | 1/2012 | Fields et al. | 362/231 |
| 8,294,162 B2 | * | 10/2012 | Nakajima | 257/88 |
| 8,294,352 B2 | * | 10/2012 | Ohmi et al. | 313/486 |
| 8,298,861 B2 | * | 10/2012 | Chen et al. | 438/108 |
| 8,427,048 B2 | * | 4/2013 | Konishi et al. | 313/505 |

FOREIGN PATENT DOCUMENTS

| | | |
|---|---|---|
| JP | 2002-118293 | 4/2002 |
| JP | 2006-245033 | 9/2006 |

* cited by examiner

*Primary Examiner* — Charles Garber
*Assistant Examiner* — Syed Gheyas
(74) *Attorney, Agent, or Firm* — Greer, Burns & Crain, Ltd.

(57) ABSTRACT

A tool cutting method which includes a correlation table preparing step of preparing a correlation table indicating the correlation between the brightness of light emitted from LED chips and the thickness of a sealing member, a brightness measuring step of measuring the brightness of light emitted from the LED chips by applying a voltage to the LED chips, a calculating step of calculating the thickness of the sealing member corresponding to the desired thickness from the brightness measured in the brightness measuring step and the correlation table, and a cutting step of cutting the sealing member by using a tool cutting unit after performing the calculating step to reduce the thickness of the sealing member to a finished thickness providing the desired brightness of light emitted from the LED chips.

1 Claim, 5 Drawing Sheets

TOOL CUTTING METHOD FOR WORKPIECE HAVING A PLURALITY OF LED CHIPS SEALED BY SEALING MEMBER

BACKGROUND OF THE INVENTION

1. Field of the Invention

The present invention relates to a tool cutting method using a tool cutting unit for cutting a workpiece having a substrate, a plurality of LED chips mounted on the substrate, and a sealing member including a fluorescent material for covering the LED chips, thereby reducing the thickness of the sealing member to a predetermined thickness providing a desired brightness of light emitted from the LED chips.

2. Description of the Related Art

In recent years, the development of a light emitting apparatus using a light emitting diode (LED) has been advanced and the LED is used for various applications in place of an incandescent lamp and a fluorescent lamp which are conventional light sources. For example, in a road traffic signal or the like, incandescent lamps covered with red, yellow, and blue color lenses as conventional signal lights are being replaced by LEDs for emitting red, yellow, and blue lights. This is due to the fact that the LED is superior in brightness and visibility and can reduce power consumption. That is, as compared with the incandescent lamp and the fluorescent lamp, the LED is superior in luminous efficiency. For such a reason, the LED is expected to be used in various cases and a light emitting apparatus having a higher usage value is being developed.

The light emitted from an LED is light having a substantially single wavelength, so that it can be used as it is in the case of emitting light having a target color. However, in the case that an LED for emitting light having a target color has not yet been developed or in the case of emitting light having a combined color such as white light obtained by combining a plurality of colors of different wavelengths, the LED cannot be used as it is. In such a case, there is used a method of dispersing a luminescent material in a sealing resin for sealing the LED. To obtain a desired brightness of light emitted from the LED, the thickness of the sealing resin must be reduced to a predetermined thickness. The upper surface of s substrate is covered (sealed) with a resin (sealing member) including a fluorescent material. Accordingly, as a conventional method, the thickness of a workpiece having a plurality of LED chips mounted on the substrate and sealed with the sealing resin is measured and the sealing resin is next cut according to the design thickness of the substrate to thereby reduce the thickness of the sealing resin to the predetermined thickness.

SUMMARY OF THE INVENTION

However, in this conventional method including the steps of measuring the thickness of the workpiece as a whole and next cutting the sealing resin according to the design thickness of the substrate to reduce the thickness of the sealing resin to the predetermined thickness, there is a problem such that the actual thickness of the substrate varies largely from the design thickness of the substrate, so that it is difficult to reduce the thickness of the sealing resin to the predetermined thickness with high accuracy.

It is therefore an object of the present invention to provide a tool cutting method using tool cutting means which can cut a workpiece having a substrate, a plurality of LED chips mounted on the substrate, and a sealing member including a fluorescent material for covering the LED chips, thereby reducing the thickness of the sealing member to a predetermined thickness providing a desired brightness of light emitted from the LED chips.

In accordance with an aspect of the present invention, there is provided a tool cutting method for cutting a workpiece composed of a substrate, a plurality of LED chips mounted on the substrate, and a sealing member for covering the LED chips, the sealing member including a fluorescent material, the sealing member of the workpiece being cut by tool cutting means to thereby reduce the thickness of the sealing member to a finished thickness providing a desired brightness of light emitted from the LED chips, the tool cutting method including a correlation table preparing step of preparing a correlation table indicating the correlation between the brightness of light emitted from the LED chips and the thickness of the sealing member; a brightness measuring step of measuring the brightness of light emitted from the LED chips by applying a voltage to the LED chips; a calculating step of calculating the thickness of the sealing member corresponding to the desired thickness from the brightness measured in the brightness measuring step and the correlation table; and a cutting step of cutting the sealing member by using the tool cutting means after performing the calculating step to reduce the thickness of the sealing member to the finished thickness providing the desired brightness of light emitted from the LED chips.

In the tool cutting method of the present invention, the brightness of light emitted from the LED chips is measured before cutting the sealing member by using the tool cutting means. Thereafter, the sealing member is cut to reduce the thickness thereof according to the measured brightness and the correlation table indicating the correlation between the brightness of the LED chips and the thickness of the sealing member. Accordingly, the thickness of the sealing member can be reduced to a finished thickness providing the desired brightness of light emitted from the LED chips.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
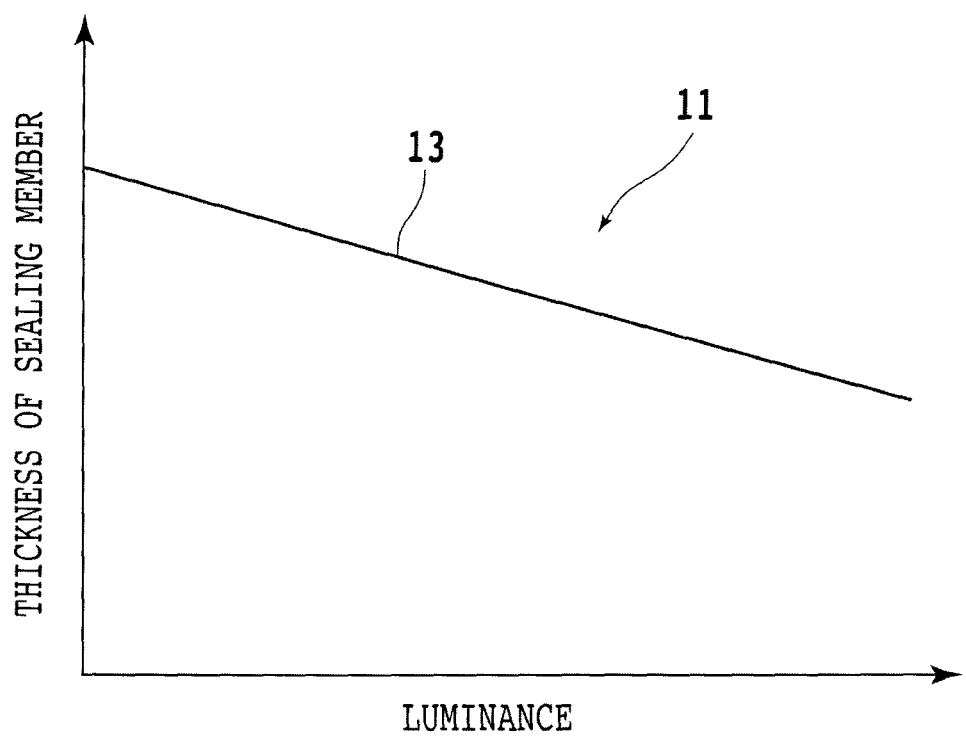
FIG. 1 is a graph showing a correlation table preparing step.

A preferred embodiment of the present invention will now be described in detail with reference to the drawings. According to the tool cutting method of the present invention, a correlation table preparing step is first performed to prepare a correlation table 11 shown in FIG. 1, which indicates the correlation between the brightness of an LED chip and the thickness of a sealing member (sealing resin) in the case of emitting light from the LED chip with the thickness of the sealing member changed. In the correlation table 11 shown in FIG. 1, a straight line 13 shows the correlation between the luminance of the LED chip and the thickness of the sealing member.

Figure 2:
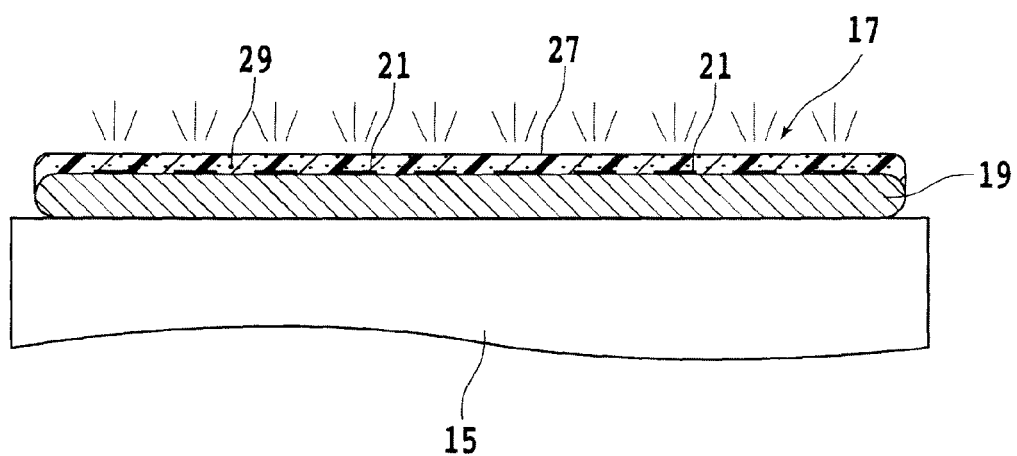
FIG. 2 is a sectional view for illustrating a brightness measuring step.

After preparing the correlation table 11, a brightness measuring step is performed to measure the brightness of an LED chip in a workpiece to be actually tool-cut in the case of applying a voltage to the LED chip to emit light from the LED chip. In this brightness measuring step, a workpiece 17 is held on a holding table 15 as shown in FIG. 2. The workpiece 17 is composed of a substrate 19, a plurality of LED chips 21 mounted on the substrate 19, and a sealing member (sealing resin) 27 for covering the plural LED chips 21. The sealing member 27 includes a fluorescent material 29.

In the brightness measuring step, a voltage is applied to the electrodes of a selected one of the plural LED chips 21 to emit light from this selected LED chip 21, and the brightness (for example, luminance) of this selected LED chip 21 is measured. This measurement is similarly made for the plural LED chips 21 mounted at different positions on the substrate 19, and the minimum of the measured values for the luminance is adopted as a measured brightness. Variations in measured brightness of the LED chips are due to nonuniformity in thickness of the sealing member 27.

As a modification, the average of the measured values for the luminance of the plural LED chips 21 may be obtained and this average may be adopted as a measured brightness. However, to make the brightness of each LED chip 21 greater than or equal to a desired brightness after tool-cutting the workpiece, the minimum of the measured values for the luminance is preferably adopted as a measured brightness.

Figure 3:
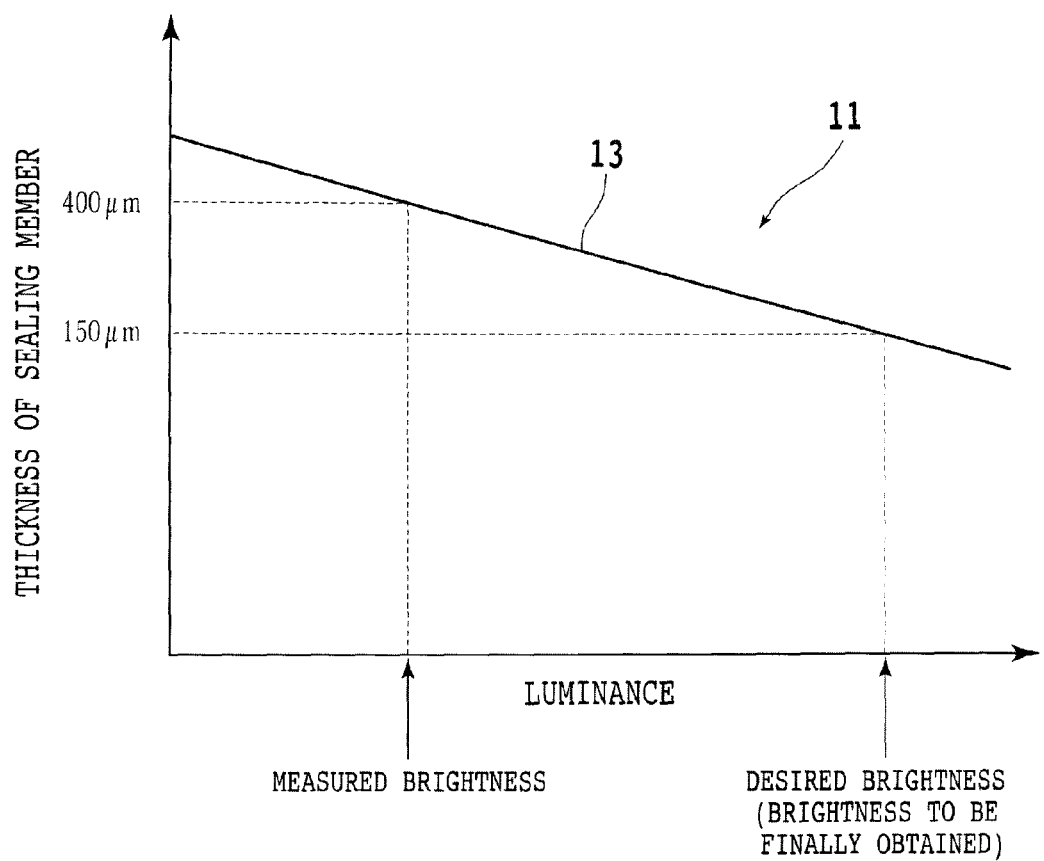
FIG. 3 is a graph showing a calculating step.

After performing the brightness measuring step, a calculating step is performed to calculate the thickness of the sealing member 27 from the measured brightness and the correlation table 11 as shown in FIG. 3. In the case that the thickness of the sealing member 27 corresponding to the measured brightness is 400 μm as shown in FIG. 3, the intersection between the straight line 13 in the correlation table 11 and a vertical line corresponding to a desired brightness to be finally obtained is determined to thereby calculate the thickness of the sealing member 27 corresponding to the desired brightness as a finished thickness of 150 μm as shown in FIG. 3. Accordingly, the thickness of the sealing member 27 to be cut in the next cutting step is calculated as 400−150=250 μm.

Figure 4:
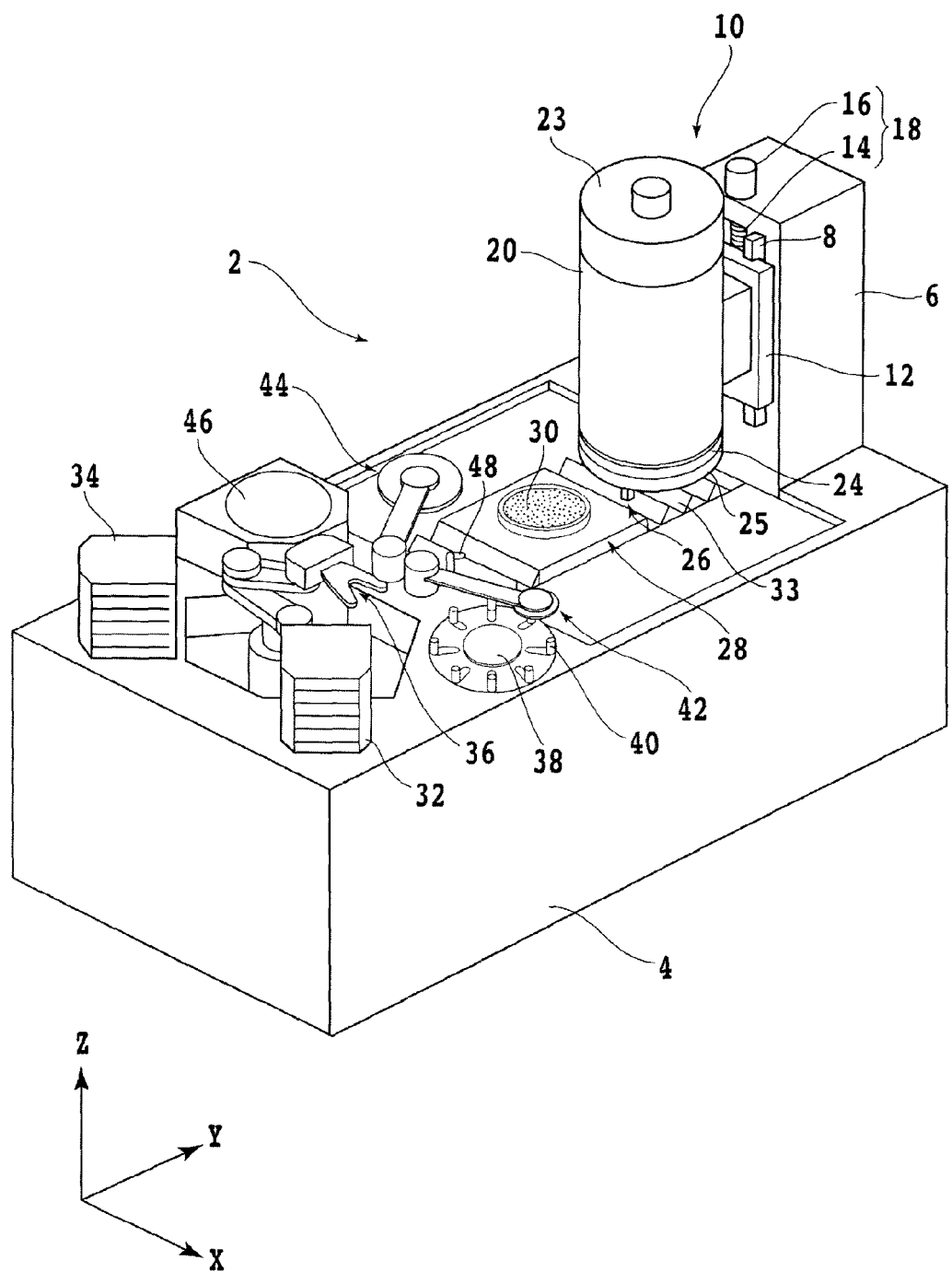
FIG. 4 is a perspective view of a tool cutting apparatus.

FIG. 4 is a perspective view of a tool cutting apparatus 2 suitable for use in performing the cutting step. In FIG. 4, reference numeral 4 denotes a base of the tool cutting apparatus 2. A column 6 stands on the upper surface of the base 4 at a rear portion thereof. A pair of vertically extending guide rails (one of which being shown) 8 are fixed to the column 6. A tool cutting unit 10 is mounted on the column 6 so as to be vertically movable along the guide rails 8. The tool cutting unit 10 has a housing 20 and a moving support 12 for supporting the housing 20, wherein the moving support 12 is vertically movable along the guide rails 8.

The tool cutting unit 10 includes the housing 20, a spindle 22 (see FIGS. 5A and 5B) rotatably accommodated in the housing 20, a mount 24 fixed to the lower end of the spindle 22, a tool wheel 25 detachably mounted on the lower surface of the mount 24, and a motor 23 for rotationally driving the spindle 22. The tool wheel 25 is provided with a detachable cutting tool 26. The tool cutting unit 10 is vertically moved along the guide rails 8 by a tool cutting unit feeding mechanism 18 including a ball screw 14 and a pulse motor 16. That is, when the pulse motor 16 is operated, the ball screw 14 is rotated to thereby vertically move the moving support 12, thus vertically moving the tool cutting unit 10.

A chuck table mechanism 28 having a chuck table 30 is provided on the upper surface of the base 4 at an intermediate portion thereof. The chuck table mechanism 28 is movable in the Y direction by a chuck table moving mechanism (not shown). A bellows 33 is provided to cover the chuck table mechanism 28. There are further provided on the upper surface of the base 4 at a front portion thereof a first wafer cassette 32, a second wafer cassette 34, a wafer transfer robot 36, a positioning mechanism 38 having a plurality of positioning pins 40, a wafer loading mechanism (loading arm) 42, a wafer unloading mechanism (unloading arm) 44, and a spinner cleaning unit 46.

Further, a cleaning water nozzle 48 for cleaning the chuck table 30 is provided at a substantially central portion of the base 4. When the chuck table 30 is moved to a front position as a wafer loading/unloading position as shown in FIG. 4, the cleaning water nozzle 48 is operated to direct a cleaning water toward the chuck table 30.

Figure 5A:
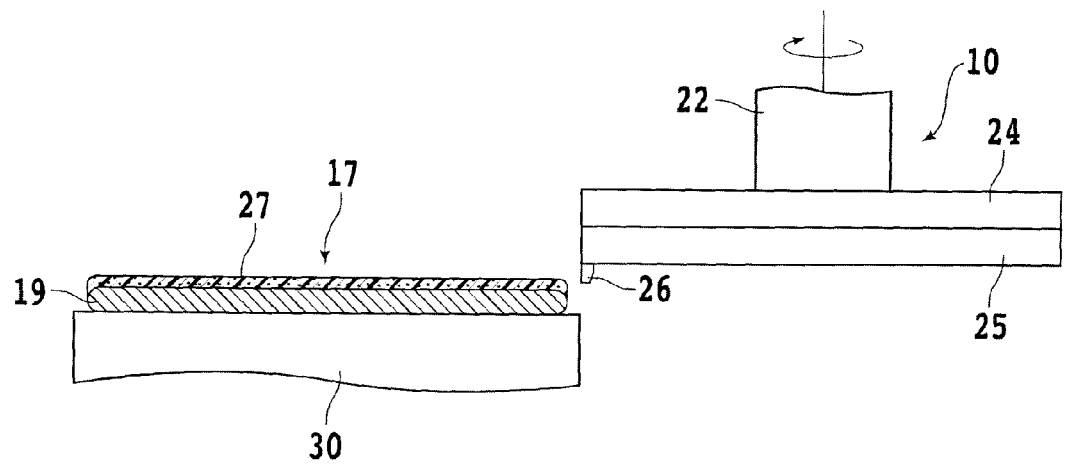
FIGS. 5A and 5B are partially sectional side views showing a cutting step.

After performing the calculating step mentioned above, the cutting step using the tool cutting apparatus 2 shown in FIG. 4 is performed in such a manner that the sealing member 27 of the workpiece 17 is cut by the tool cutting unit 10 to reduce the thickness of the sealing member 27 to a finished thickness corresponding to the desired brightness of the LED chips 21. In this cutting step, the height of the upper surface of the workpiece 17 held on the chuck table 30 is detected and the lower end of the cutting tip of the cutting tool 26 is set at a position lower than the height detected above by 250 μm as shown in FIG. 5A. At this time, the rotation of the spindle 22 is optional.

Figure 5B:
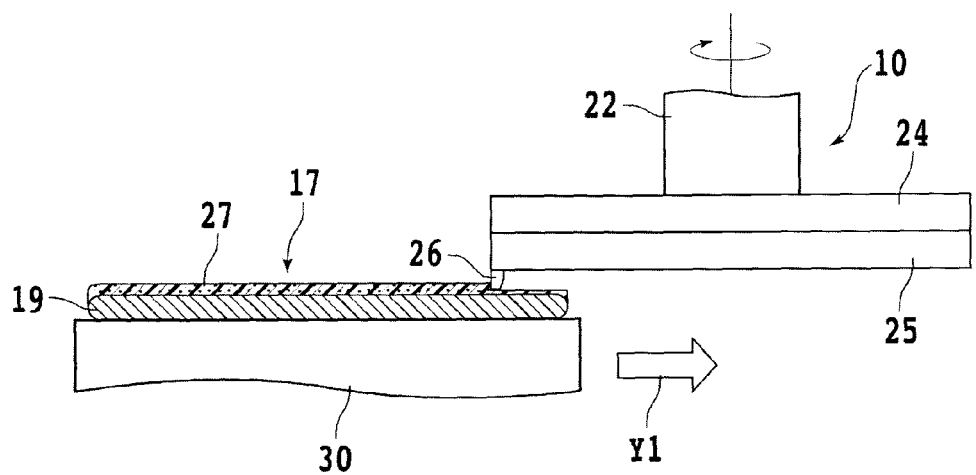

After thus positioning the cutting tool 26, the tool wheel 25 is rotated at about 2000 rpm, for example, and the chuck table 30 is moved in the direction shown by an arrow Y1 in FIG. 5B at a predetermined feed speed to thereby cut the sealing member 27 with the cutting tool 26 rotating about the axis of the spindle 22. In this cutting operation, the chuck table 30 is not rotated, but only fed in the Y1 direction. By performing this cutting step, the thickness of the sealing member 27 is reduced to a finished thickness of 150 μm corresponding to the desired brightness of the LED chips 21.

While luminance is adopted as the brightness in the above preferred embodiment, the brightness in the present invention may be based on any one of illuminance, luminous intensity, and luminous flux or may be based on the combination of luminance, illuminance, luminous intensity, and luminous flux.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A tool cutting method for cutting a workpiece composed of a substrate, a plurality of light-emitting diode chips mounted on said substrate, and a sealing member for covering said light-emitting diode chips, said sealing member including a fluorescent material, said sealing member of said workpiece being cut by tool cutting means to thereby reduce the thickness of said sealing member to a finished thickness providing a desired brightness of light emitted from said light-emitting diode chips, said tool cutting method comprising:

a correlation table preparing step of preparing a correlation table indicating the correlation between the brightness of light emitted from said light-emitting diode chips and the thickness of said sealing member;

a brightness measuring step of measuring the brightness of light emitted from said light-emitting diode chips by applying a voltage to said light-emitting diode chips;

a calculating step of calculating the thickness of said sealing member corresponding to said desired thickness from the brightness measured in said brightness measuring step and said correlation table; and a cutting step of cutting said sealing member by using said tool cutting means after performing said calculating step to reduce the thickness of said sealing member to said finished thickness providing said desired brightness of light emitted from said light-emitting diode chips.

\* \* \* \* \*